United States Patent
Saeidi et al.

(10) Patent No.: US 10,188,015 B2
(45) Date of Patent: Jan. 22, 2019

(54) HYBRID DESIGN OF HEAT SPREADER AND TEMPERATURE SENSOR FOR DIRECT HANDHELD DEVICE SKIN TEMPERATURE MEASUREMENT

(71) Applicant: QUALCOMM Incorporated, San Diego, CA (US)

(72) Inventors: Mehdi Saeidi, San Diego, CA (US); Rajat Mittal, San Diego, CA (US); Ryan Coutts, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 297 days.

(21) Appl. No.: 15/270,305

(22) Filed: Sep. 20, 2016

(65) Prior Publication Data
US 2018/0084667 A1 Mar. 22, 2018

(51) Int. Cl.
*H05K 7/20* (2006.01)
*G01K 7/18* (2006.01)
*G06F 1/20* (2006.01)

(52) U.S. Cl.
CPC .......... *H05K 7/2039* (2013.01); *G01K 7/183* (2013.01); *G06F 1/203* (2013.01); *G01K 2217/00* (2013.01)

(58) Field of Classification Search
None
See application file for complete search history.

(56) References Cited

U.S. PATENT DOCUMENTS

| | | | |
|---|---|---|---|
| 6,255,622 B1 | 7/2001 | May et al. | |
| 6,321,175 B1 * | 11/2001 | Nagaraj | G01K 7/42 257/467 |
| 6,504,712 B2 * | 1/2003 | Hashimoto | H01L 21/4878 165/80.3 |
| 6,909,602 B2 | 6/2005 | Dietrich et al. | |
| 8,198,976 B2 * | 6/2012 | Thomsen | G01K 7/028 338/20 |
| 9,476,785 B2 * | 10/2016 | Ivanov | B82Y 30/00 |
| 9,891,114 B2 * | 2/2018 | Karlen | G01K 7/02 |

(Continued)

FOREIGN PATENT DOCUMENTS

WO 2007091299 A1 8/2007
WO 2015123394 A1 8/2015

OTHER PUBLICATIONS

International Search Report and Written Opinion—PCT/US2017/046472—ISA/EPO—dated Oct. 26, 2017.

*Primary Examiner* — Alexander Satanovsky
*Assistant Examiner* — Lina M Cordero
(74) *Attorney, Agent, or Firm* — Muncy, Geissler, Olds & Lowe, P.C.

(57) ABSTRACT

The disclosure generally relates to a hybrid design whereby a heat spreader arranged to reduce an external skin temperature on a handheld device may further enable the external skin temperature to be directly measured. For example, the heat spreader may be thermally coupled to at least one external surface and include at least one region in which a plurality of recesses are formed such that an electrical resistance is produced in the at least one region when a current is applied thereto. The heat spreader may be formed from a material having a substantially linear resistance-to-temperature correlation, whereby the electrical resistance produced in the at least one region may be measured and correlated to a temperature on the at least one external surface.

25 Claims, 5 Drawing Sheets

(56) References Cited

U.S. PATENT DOCUMENTS

| | | | |
|---|---|---|---|
| 2005/0114068 A1* | 5/2005 | Chey | G01K 1/026 |
| | | | 702/130 |
| 2006/0067045 A1* | 3/2006 | Ali | G06F 1/203 |
| | | | 361/679.47 |
| 2009/0039073 A1* | 2/2009 | Guo | G01K 7/18 |
| | | | 219/494 |
| 2009/0285261 A1* | 11/2009 | Casey | G01K 1/026 |
| | | | 374/178 |
| 2010/0118916 A1 | 5/2010 | Thomsen, III et al. | |
| 2011/0090631 A1* | 4/2011 | Atkinson | G06F 1/203 |
| | | | 361/679.26 |
| 2011/0103020 A1* | 5/2011 | Dangelo | B82Y 10/00 |
| | | | 361/709 |
| 2012/0091573 A1* | 4/2012 | Sasaki | H01L 23/3107 |
| | | | 257/717 |
| 2013/0248511 A1* | 9/2013 | Wallinger | H05B 3/26 |
| | | | 219/510 |
| 2013/0277352 A1* | 10/2013 | Degen | H05B 3/84 |
| | | | 219/203 |
| 2015/0043161 A1 | 2/2015 | Nelson et al. | |
| 2015/0075186 A1 | 3/2015 | Prajapati | |
| 2015/0229155 A1 | 8/2015 | Sporck et al. | |
| 2017/0176260 A1* | 6/2017 | Ferguson | G01K 7/16 |

\* cited by examiner

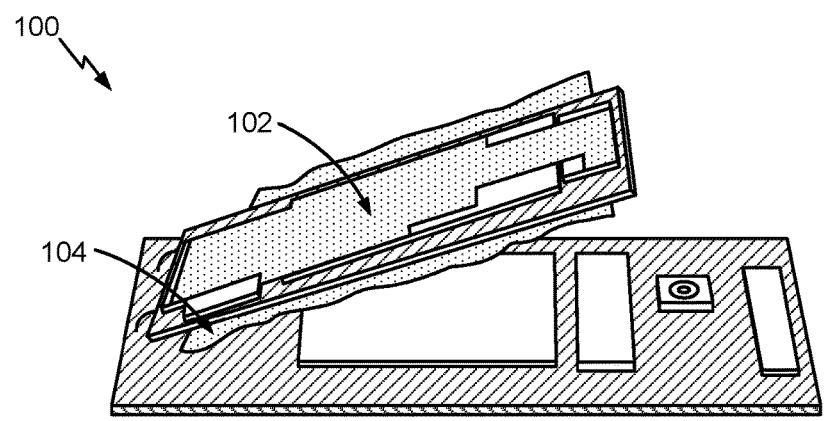
FIG. 1
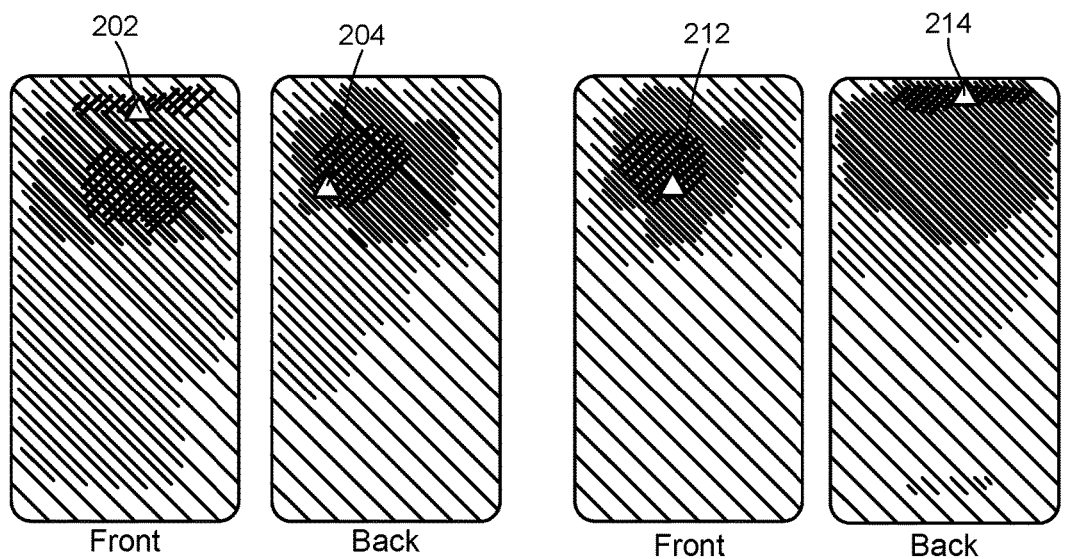
FIG. 2A    FIG. 2B

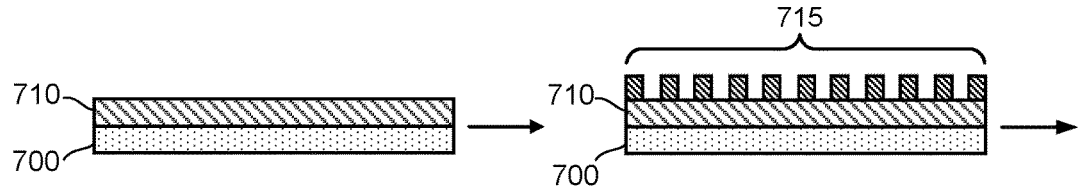
FIG. 7A  FIG. 7B
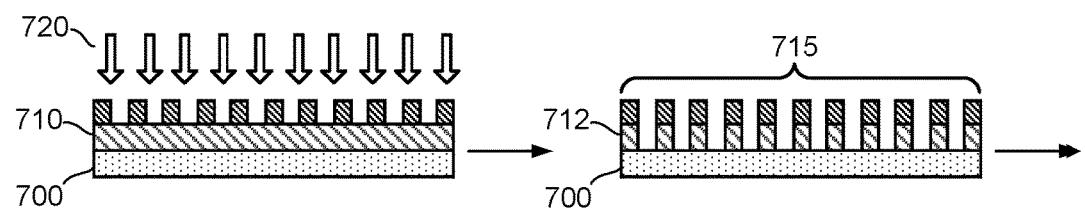
FIG. 7C  FIG. 7D
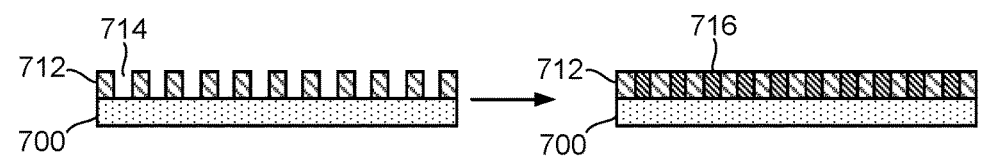
FIG. 7E  FIG. 7F

HYBRID DESIGN OF HEAT SPREADER AND TEMPERATURE SENSOR FOR DIRECT HANDHELD DEVICE SKIN TEMPERATURE MEASUREMENT

TECHNICAL FIELD

The various aspects and embodiments described herein generally relate to measuring and controlling skin temperature in handheld electronic devices.

BACKGROUND

As handheld and portable electronic devices (e.g., smartphones, tablets, wearables, etc.) increase in capability and functionality, the electronic components within the devices must provide improved computational performance levels. In order to achieve the higher computational performance levels, electronic devices tend to dissipate increasing amounts of energy in the form of heat. Due to the compact size associated with typical portable electronic devices, the energy dissipation can result in temperature increases both within the electronic device and at the exterior surface (or "skin") associated with the device. Accordingly, because human skin can be sensitive to the heat dissipated at the device surface, the skin or surface temperature is a critical design constraint in many (if not all) electronic devices that are designed to come into contact with the human body (e.g., a user's hand, ear, face, etc.). For example, temperatures at one or more device surfaces (e.g., a housing surface, a back cover surface, a liquid crystal display (LCD) surface, etc.) may become too hot to touch, thus leading to an uncomfortable user experience. Furthermore, high temperature surfaces can become a safety hazard due to local skin burning. Accordingly, performance in handheld and other portable electronic devices tends to be limited due to limited power budgets based on thermal limits on skin temperature and silicon junction temperature (Tj), wherein the latter refers to the temperature limit on active layers in the semiconductor chip or chips within the device. However, skin temperature tends to be the more strict limits and represents the performance bottleneck in most use cases.

One issue that engineers and designers face when attempting to adhere to the above-mentioned thermal limitations is the difficulty to directly measure the skin temperature. For example, portable electronic devices typically do not have sufficient space to house active cooling devices, such as fans, which are often found in larger computing devices such as laptop and desktop computers. Instead, portable electronic devices may be designed to spatially arrange electronic components so that two or more active and heat-producing components are not positioned proximally to one another. Many portable electronic devices also rely on passive cooling devices, such as heat sinks, to manage thermal energy among the heat-producing electronic components. However, due to size limitations, portable electronic devices typically do not have enough space to use clever spatial arrangements or strategically placed passive cooling components. Therefore, current systems and methods typically employ on-chip and/or on-board temperature sensors to predict skin temperature based on calibration tests. In reality, however, predicting skin temperature using on-chip and/or on-board temperature sensors may be inaccurate because the on-chip and/or on-board temperature sensors may be sensitive to power changes (e.g., due to active usage) even though skin temperature may respond more slowly. Furthermore, in other situations, the on-chip and/or on-board temperature sensors may not react to increases in skin temperature that occur independently from on-chip and/or on-board activity (e.g., where the battery becomes hot while charging despite the device not being in active use).

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

According to various aspects, a combined heat spreader and temperature sensor design may directly measure skin temperature in a handheld device. More particularly, many portable electronic devices typically include copper sheets, graphite-based sheets, and/or other elements to spread heat and reduce skin temperature. As such, the combined heat spreader and skin temperature sensor described herein may have a design that introduces small gaps in the heat spreader element to build an electrical resistance, whereby changes in the resistance can therefore be used to measure the skin temperature (e.g., a resistance temperature detector (RTD)) without adding to the overall thickness associated with the device. In various embodiments, the heat spreader coverage may be kept high (e.g., above 95%) across the skin area to avoid compromising the heat spreading properties. As such, the RTD electrical resistance may be measured using a two-wire or four-wire Kelvin method, and the measured RTD electrical resistance can then be correlated with the skin temperature, as changes between copper resistance and copper temperature are usually very linear.

According to various aspects, the combined heat spreader and skin temperature sensor may be thermally coupled to the back surface in a portable electronic device to spread the heat over a system-on-chip (SoC). In addition, to measure the skin temperature, the combined heat spreader and skin temperature sensor may be connected to a printed circuit board (PCB) to measure the resistance and correlate the measured resistance with the skin temperature. In various embodiments, the combined heat spreader and skin temperature sensor may include a design that includes multiple sensors over multiple potential hotspots (e.g., to measure electric resistance at or near the SoC, a camera, a power management integrated circuit (PMIC), etc.), which may increase the skin temperature resolution and mitigation accuracy.

According to various aspects, the combined heat spreader and skin temperature sensor may be built using standard device fabrication processes. For example, a copper sheet or other heat spreader may be placed over a dielectric material and a mask can then be placed over the copper sheet, wherein the mask may be patterned based on the areas where skin temperature is to be measured. In various embodiments, a chemical or plasma etching process may then be applied such that recesses are formed in the copper sheet where the electrical resistance is to be measured. The mask may then be removed and the recesses filled with a dielectric material.

According to various aspects, a handheld electronic device may comprise at least one external surface, a heat spreader thermally coupled to the at least one external surface, and a circuit electrically connected to the heat spreader. The heat spreader may comprise at least one region having a plurality of recesses arranged to produce an electrical resistance in the at least one region and the circuit may be configured to measure the electrical resistance in the at least one region and to correlate the measured electrical resistance to a skin temperature on the at least one external surface. According to various aspects, the heat spreader may be formed from a thermally and electrically conductive material having a substantially linear resistance-to-temperature correlation such that a maximum allowable electrical resistance in the at least one region may be determined based on a maximum allowable skin temperature on the at least one external surface and the substantially linear resistance-to-temperature correlation associated with the thermally and electrically conductive material used to form the heat spreader. As such, the circuit may initiate one or more mitigation techniques to reduce the skin temperature on the external surface based on the measured electrical resistance in the at least one region exceeding the maximum allowable electrical resistance. According to various aspects, the circuit configured to measure the electrical resistance and to correlate the measured electrical resistance to the skin temperature may be further configured to flow a current through the at least one region in the heat spreader and to measure the electrical resistance in the at least one region based on a voltage drop across at least one of the plurality of recesses formed in the at least one region (e.g., according to a two-wire or four-wire Kelvin method).

According to various aspects, a method for directly measuring skin temperature in a handheld electronic device may comprise causing a current to flow through at least one region in a heat spreader thermally coupled to at least one external surface of the handheld electronic device, wherein a plurality of recesses may be formed in the at least one region of the heat spreader to produce an electrical resistance therein, measuring the electrical resistance produced in the at least one region, and correlating the measured electrical resistance to a skin temperature on the at least one external surface.

According to various aspects, an apparatus may comprise means for generating heat in a handheld electronic device, means for spreading the heat to reduce a skin temperature on at least one external surface of the handheld electronic device, means for producing an electrical resistance in the means for spreading the heat, means for measuring the electrical resistance, and means for determining the skin temperature on the at least one external surface based on the measured electrical resistance.

According to various aspects, a hybrid heat spreader and skin temperature sensor may comprise a metal sheet formed from a thermally and electrically conductive material having a substantially linear resistance-to-temperature correlation and at least one resistance temperature detector formed in at least one region of the metal sheet, wherein the at least one resistance temperature detector may comprise a plurality of recesses formed in the metal sheet and a first lead and a second lead formed on opposite sides of one of the plurality of recesses. The plurality of recesses may be formed according to a pattern arranged to flow an input current applied to the first lead through the at least one region of the metal sheet along a path from the first lead to the second lead such that an electrical resistance is produced between the first lead and the second lead. As such, an external circuit may measure the electrical resistance between the first lead and the second lead and determine an external skin temperature near the at least one resistance temperature detector based on the measured electrical resistance and the substantially linear resistance-to-temperature correlation associated with the thermally and electrically conductive material from which the metal sheet is formed.

Other objects and advantages associated with the aspects and embodiments disclosed herein will be apparent to those skilled in the art based on the accompanying drawings and detailed description.

BRIEF DESCRIPTION OF THE DRAWINGS

A more complete appreciation of the various aspects and embodiments described herein and many attendant advantages thereof will be readily obtained as the same becomes better understood by reference to the following detailed description when considered in connection with the accompanying drawings which are presented solely for illustration and not limitation, and in which:

FIG. 1 illustrates an exemplary handheld device having one or more heat spreaders arranged to reduce skin temperature, according to various aspects.

FIG. 2A-2B illustrate exemplary handheld devices with hot spots on a front surface and a back surface, according to various aspects.

FIG. 7A-7F illustrates an exemplary process flow to form the hybrid heat spreader and temperature sensor described herein, according to various aspects.

DETAILED DESCRIPTION

Figure 3A:
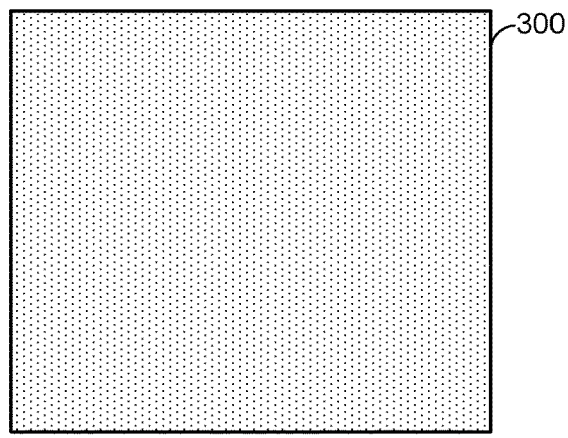
FIG. 3A-3B illustrate an exemplary design approach used in a hybrid heat spreader and temperature sensor, according to various aspects.

Various aspects and embodiments are disclosed in the following description and related drawings to show specific examples relating to exemplary aspects and embodiments. Alternate aspects and embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage, or mode of operation.

The terminology used herein describes particular embodiments only and should not be construed to limit any embodiments disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequence of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

According to various aspects, a combined heat spreader and temperature sensor design may directly measure skin temperature in a handheld device. More particularly, many portable electronic devices typically include copper sheets, graphite-based sheets, and/or other elements to spread heat and reduce skin temperature. As such, the combined heat spreader and skin temperature sensor described herein may have a design that introduces small gaps in the heat spreader element to build an electrical resistance, whereby changes in the resistance can therefore be used to measure the skin temperature (e.g., a resistance temperature detector (RTD)) without adding to the overall thickness associated with the device. In various embodiments, the heat spreader coverage may be kept high (e.g., above 95%) across the skin area to avoid compromising the heat spreading properties. As such, the RTD electrical resistance may be measured using a two-wire or four-wire Kelvin method, and the measured RTD electrical resistance can then be correlated with the skin temperature, as changes between copper resistance and copper temperature are usually very linear. Accordingly, the various aspects and embodiments described herein may generally use a thermally and electrically conductive material in the combined heat spreader and temperature sensor design, as the thermally conductive properties may serve to spread heat and thereby reduce skin temperature while the electrically conductive properties may be used to measure the electrical resistance built in the heat spreader element.

According to various aspects, the combined heat spreader and skin temperature sensor may be thermally coupled to the back surface in a portable electronic device to spread the heat over a system-on-chip (SoC). In addition, to measure the skin temperature, the combined heat spreader and skin temperature sensor may be connected to a printed circuit board (PCB) to measure the resistance and correlate the measured resistance with the skin temperature. In various embodiments, the combined heat spreader and skin temperature sensor may include a design that includes multiple sensors over multiple potential hotspots (e.g., to measure electric resistance at or near the SoC, a camera, a power management integrated circuit (PMIC), etc.), which may increase the skin temperature resolution and mitigation accuracy.

According to various aspects, the combined heat spreader and skin temperature sensor may be built using standard device fabrication processes. For example, a copper sheet or other heat spreader may be placed over a dielectric material and a mask can then be placed over the copper sheet, wherein the mask may be patterned based on the areas where skin temperature is to be measured. In various embodiments, a chemical or plasma etching process may then be applied such that recesses are formed in the copper sheet where the electrical resistance is to be measured. The mask may then be removed and the recesses filled with a dielectric material.

As used herein, the term "handheld device" may generally refer to any suitable electronic device that has a programmable processor and memory in addition to one or more external surfaces that may come into contact with human skin (e.g., a human hand, face, ear, etc.). Accordingly, in the description provided herein, the term "handheld device" may refer to a cellular telephone, a personal data assistant (PDA), a palm-top computer, a laptop computer, a mobile electronic mail receiver, a tablet computer, a wireless headset, wearable glasses, and/or any other suitable electronic device with one or more external surfaces designed to potentially come into contact with human skin.

For example, FIG. 1 illustrates an example handheld device 100 that has one or more external surfaces that may come into contact with human skin. The handheld device 100 may include one or more electronic components, which may include a power management integrated circuit (PMIC), a data processor, communication circuitry (e.g., a mobile station modem), interface electronics, a battery charger, display circuitry, one or more cameras, etc. In the particular example shown in FIG. 1, the handheld device 100 may include a front cover, a display screen, a power button, and/or other suitable components on a front surface (e.g., a front-facing camera). In addition, the handheld device 100 may include a back cover, a rear-facing camera, etc. on a back surface as well as various internal components housed between the front cover and the back cover. During operation, the various components associated with the handheld device 100 may generate heat, which may generally be removed from the handheld device 100 via conduction within the handheld device 100 and via natural convection and radiation on the external surface(s) or "skin" associated with the handheld device 100. As such, the heat that radiates out through the external surface(s) may affect temperature on the external surface(s) and consequently affect user comfort (e.g., potentially reaching a point that could be harmful or undesirable to a user touching the external surface(s)).

Accordingly, based on safety and ergonomic reasons, handheld devices are often subject to design constraints whereby skin temperature mitigation techniques are used to maintain external surface temperatures below a maximum allowable skin temperature (e.g., 40~45° Celsius). For example, FIG. 2A illustrates an exemplary handheld device with a first hot spot 202 on a front surface and a second hot spot 204 on a back surface and FIG. 2B similarly illustrates an exemplary handheld device with a first hot spot 212 on a front surface and a second hot spot 214 on a back surface. In FIG. 2A and FIG. 2B, the temperatures at the hot spots 202, 212 on the front surfaces and the temperatures at the hot spots 204, 214 on the back surfaces both exceed the maximum allowable skin temperature above which skin temperature mitigation is to be employed. More particularly, skin temperature mitigation may generally be used to maintain the temperatures at the external surface(s) below the maximum allowable skin temperature through reducing power, reducing performance, and/or other suitable techniques to keep the external surface(s) at a temperature below the maximum allowable skin temperature.

Conventional techniques to measure skin temperature generally use on-chip temperature sensors (e.g., on an integrated circuit die) or an off-chip temperature sensor. However, the conventional techniques have limitations with respect to the ability to predict or otherwise accurately measure skin temperature. For example, approaches that use on-chip temperature sensors often involve substantial testing and modeling to map on-chip temperatures or changes in power to temperatures on the external surface, although temperatures on the external surface may respond to internal changes in temperature or power more slowly than on-chip sensors. In that sense, temperature mitigation techniques could potentially be initiated prematurely (e.g., before the internal heat has dissipated to the external surface). Alternatively, there may be certain use cases where the external surface reaches the maximum allowable temperature limit and the on-chip and/or off-chip temperature sensors are unable to detect the temperature increase because the change in temperature is not attributable to any operational aspects associated with the handheld device 100 (e.g., charging the battery could cause the rear external surface to become hot even though the internal processor is idle). In other examples, an on-chip temperature sensor may detect a significant drop in temperature when an application crashes, although thermocouples at the external surfaces may not sense or reflect the temperature drop because the external surfaces respond to internal temperature changes more slowly (or not at all where the application recovers before the temperature changes at the external surfaces). In other words, where on-chip and off-chip temperature sensors employ models or test results to predict skin temperature rather than measuring skin temperature directly, there may be no proof that the actual skin temperature reflects the predicted skin temperature.

In various embodiments, a temperature sensor design as described herein may therefore leverage the fact that many handheld devices include heat spreaders arranged to dissipate heat generated internally within the handheld devices before the heat has a chance to reach the external surface. For example, referring again to FIG. 1, the handheld device 100 shown therein includes a first heat spreader 102 arranged between a printed circuit board and the rear external surface and a second heat spreader 104 arranged between the printed circuit board and the front external surface. As such, the heat spreaders 102, 104 may reduce the heat that radiates out through the external surface, wherein the heat spreaders 102, 104 may include metal sheets formed from copper, graphite, aluminum, and/or other suitable materials that can spread heat on front and/or rear external covers, on electromagnetic interference (EMI) shields, on printed circuit boards, under a display, etc. and thereby reduce skin temperature.

Figure 3B:
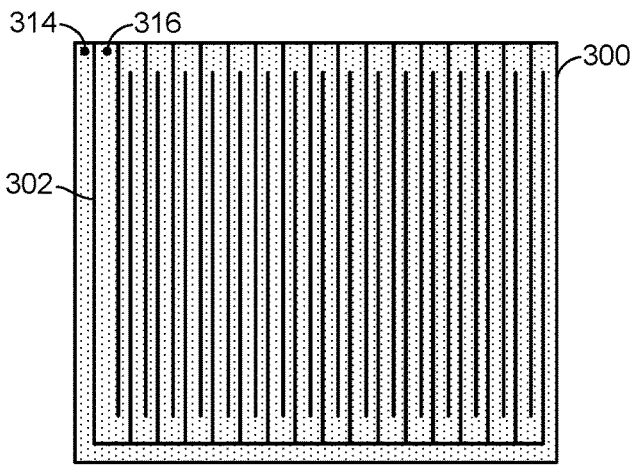

According to various aspects, FIG. 3A and FIG. 3B illustrate an exemplary design approach that can be used in a hybrid heat spreader and temperature sensor as described herein. More particularly, FIG. 3A illustrates a typical heat spreader 300 that may be used in a handheld device to spread heat generated internally within the handheld device to thereby reduce an external skin temperature. As shown in FIG. 3B, various recesses 302 may be formed in the heat spreader 300 (e.g., via a masking and etching process or other suitable technique). In various embodiments, the recesses 302 may be formed to build an electrical resistance in the heat spreader 300, wherein the recesses 302 may be formed according to a pattern such that a material used to form the heat spreader 300 is maintained at a high coverage (e.g., above ninety-five percent) to maintain the heat spreading properties associated therewith. Furthermore, the pattern in which the recesses 302 are formed may be such that the first two recesses 302 start at an edge of the heat spreader 300 and the first recess 302 has a longer length than the second recess 302. The remaining recesses 302 may be formed in an alternating pattern whereby one recess 302 starts some distance away from the edge of the heat spreader 300 and has the same terminating position as the first recess 302 and the next recess 302 has essentially the same starting and terminating positions as the second recess 302. The final recess 302 (e.g., the right-most recess 302 in FIG. 3B) may also start some distance away from the edge of the heat spreader 300 and have the same terminating position as the first recess 302. Accordingly, one recess 302 perpendicular to all other recesses 302 may be formed to connect the first, third, fifth, etc. recesses 302, and two leads 314, 316 may be provided on either side of the first recess 302. As such, in various embodiments, the pattern in which the recesses 302 are formed may be such that a current applied to the lead 314 travels through the material used to form the heat spreader 300 and the current eventually arrives at the lead 316 provided on the opposite side of the first recess 302, whereby a resistance between the two leads 314, 316 can be directly measured and correlated to a temperature within the heat spreader 300.

Figure 3C:
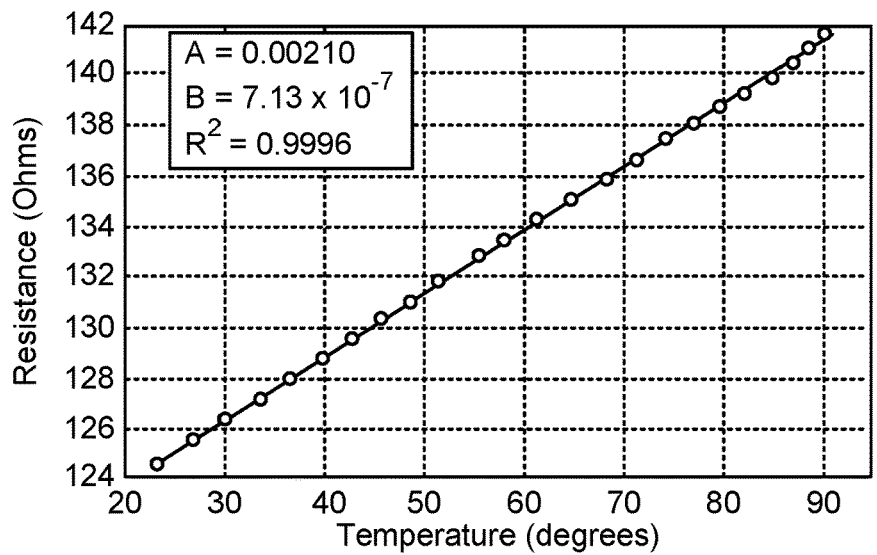
FIG. 3C illustrates an exemplary relationship between resistance and temperature that may be considered in the hybrid heat spreader and temperature sensor design, according to various aspects.

Accordingly, based on the design shown in FIG. 3B, the temperature correlated to the measured resistance across the two leads 314, 316 may provide a direct skin temperature measurement that can then be used to mitigate skin temperature as needed. Furthermore, the design shown in FIG. 3B does not add to the thickness associated with the device in which skin temperature is measured because the starting structure (i.e., the heat spreader 300 shown in FIG. 3A) may be one conventionally used to spread heat in a handheld device. Additionally, the heat spreader 300 may be formed from a material that has a substantially linear resistance-to-temperature correlation, which makes the resistance measurement an accurate indicator with respect to skin temperature. For example, FIG. 3C illustrates a resistance-to-temperature correlation applicable to copper, which is a material often used in a handheld device heat spreader. In particular, as shown in FIG. 3C, increases in resistance result in a substantially linear temperature increase, whereby the maximum allowable skin temperature may therefore be used to determine a maximum allowable resistance above which skin temperature mitigation should be initiated. For example, assuming that the maximum allowable skin temperature is ~45° Celsius, skin temperature mitigation may be initiated at a measured resistance at or above ~130 ohms. However, those skilled in the art will appreciate that the measured resistance above which skin temperature mitigation is initiated may vary depending on various factors, which may include but are not limited to the material(s) used in the heat spreader 300, a resistance-to-temperature correlation associated with the material(s) used in the heat spreader 300, the particular design constraints associated with the applicable handheld device in which the heat spreader 300 is used, etc.

Figure 4A:
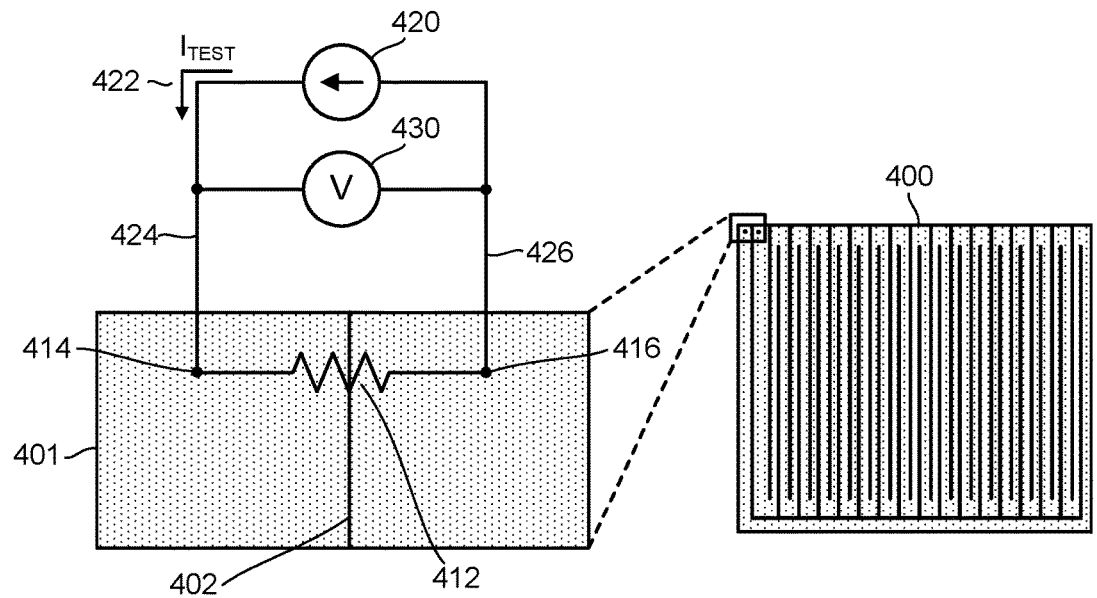
FIG. 4A-4B illustrate exemplary two-wire and four-wire methods to measure a resistance indicating a direct skin temperature measurement using a hybrid heat spreader and temperature sensor, according to various aspects.
Figure 4B:
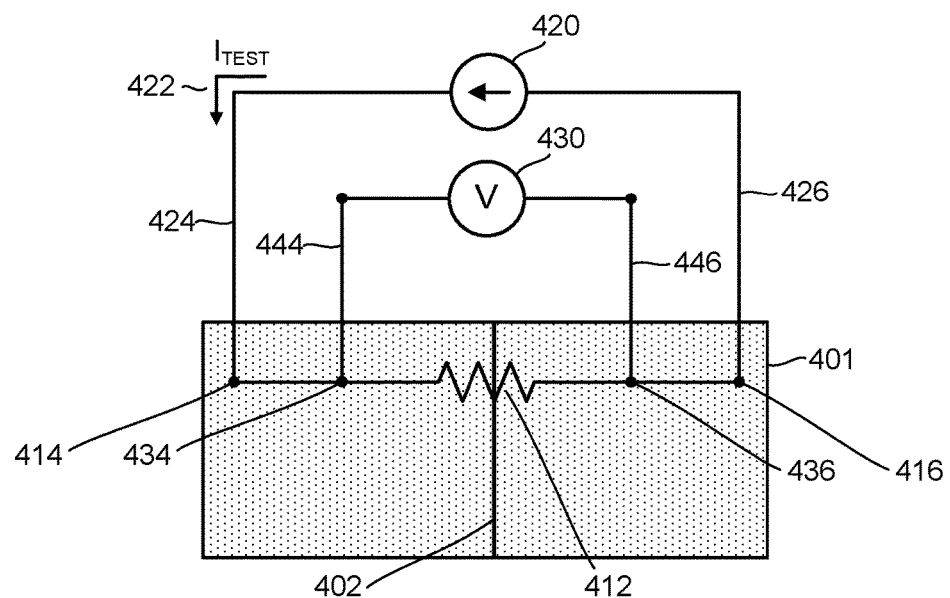

According to various aspects, FIG. 4A and FIG. 4B respectively illustrate an example two-wire Kelvin method and an example four-wire Kelvin method that can be used to make a direct skin temperature measurement using a hybrid heat spreader and temperature sensor 400, which may have the same or at least a substantially similar design as shown in FIG. 3B. Referring specifically to the example two-wire Kelvin method in FIG. 4A, the hybrid heat spreader and temperature sensor 400 includes a portion 401 having a first lead 414 and a second lead 416 disposed on opposite sides of at least one recess 402. Accordingly, to make a direct skin temperature measurement using the hybrid heat spreader and temperature sensor 400, the two-wire Kelvin method shown in FIG. 4A may be used to measure a resistance 412 between the first lead 414 and the second lead 416, whereby a resistance-to-temperature correlation associated with the material(s) used in the hybrid heat spreader and temperature sensor 400 can be used to correlate the measured resistance 412 to a direct skin temperature measurement. For example, in various embodiments, a current source 420 may be used to apply a test current ($I_{TEST}$) 422 to the first lead 414 such that the test current 422 flows through the hybrid heat spreader and temperature sensor 400 between the first lead 414 and the second lead 416 as described in further detail above. As such, a voltmeter 430 may measure a voltage between the first lead 414 and the second lead 416 such that the measured voltage ($V_{MEAS}$) can be used to compute the resistance 412 between the first lead 414 and the second lead 416 according to Ohm's law (i.e., where the measured resistance 412 is $V_{MEAS}/I_{TEST}$). However, those skilled in the art will appreciate that other possible circuits can be used to measure the resistance 412 according to the two-wire Kelvin method (e.g., rather than using the current source 420 such that $I_{TEST}$ has a known value, a power source may be used to drive the circuit such that an ammeter could be used to obtain $I_{TEST}$ in combination with the voltmeter 430 obtaining $V_{MEAS}$).

According to various aspects, as the name implies, the two-wire Kelvin method as shown in FIG. 4A uses two wires 424, 426 to measure the resistance 412 between the first lead 414 and the second lead 416. As such, because the two wires 432, 434 that are connected to the leads 414, 416 also have resistances, the resistances associated with the wires 432, 434 may be considered in the measurement. For example, assuming that the wires 432, 434 have a known resistance ($R_{LEAD}$), the resistance 412 between the first lead 414 and the second lead 416 may be computed as $V_{MEAS}/I_{TEST}-(2*R_{LEAD})$. However, where $R_{LEAD}$ is not known or the resistance 412 between the first lead and the second lead 416 is relatively small (e.g., under one-hundred ohms), the two-wire Kelvin method may be prone to greater error because the test current 422 may cause a voltage drop across the wires 432, 434 and thereby cause $V_{MEAS}$ as measured at the voltmeter 430 to have a value that differs from the actual voltage between the leads 414, 416.

As such, according to various aspects, FIG. 4B shows an example circuit implementing the four-wire Kelvin method to measure the resistance 412 that can be correlated to the direct skin temperature measurement. The four-wire Kelvin method as shown in FIG. 4B may generally be similar to the two-wire Kelvin method as shown in FIG. 4A, except that the four-wire Kelvin method uses two additional leads 434, 436 and two additional wires 444, 446 to reduce errors that could result from the resistance $R_{LEAD}$ across the two wires 424, 426 used to supply the test current 422 that flows through the hybrid heat spreader and temperature sensor 400. More particularly, in the example circuit shown in FIG. 4B, the voltmeter 430 may measure a voltage between the two additional leads 434, 436 to obtain $V_{MEAS}$ without the resistance $R_{LEAD}$ across the two wires 424, 426 introducing an additional voltage drop to be considered in the measurement. Furthermore, although a small current may flow through the additional wires 444, 446 via the additional leads 434, 436, the current is sufficiently small that any resistances in the additional wires 444, 446 will not contribute significant error to the value that the voltmeter 430 obtains with respect to $V_{MEAS}$. Accordingly, in the four-wire Kelvin method as shown in FIG. 4B, the voltage $V_{MEAS}$ that the voltmeter 430 measures between the additional leads 434, 436 may be used to measure the resistance 412 in the hybrid heat spreader and temperature sensor 400 more accurately. In addition, as with FIG. 4A, those skilled in the art will appreciate that other suitable circuits can be used to measure the resistance 412 according to the four-wire Kelvin method, which may include but are not limited to circuits in which a power source is used to drive the circuit and an ammeter is used to measure the test current 422 that flows from the first lead 414 to the second lead 414.

Figure 5:
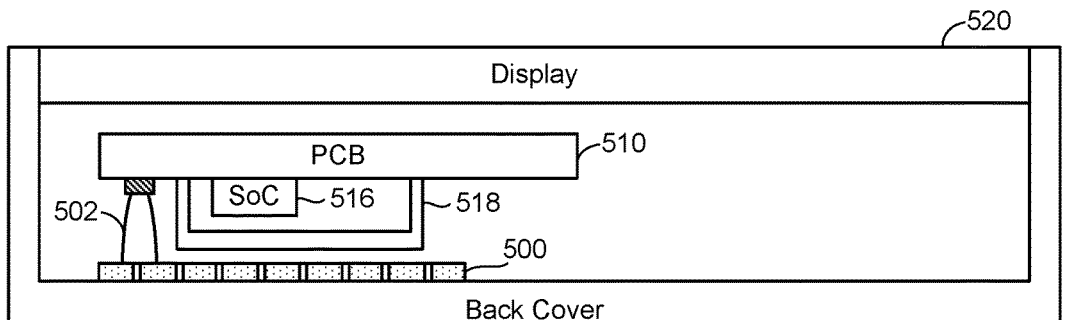
FIG. 5 illustrates an exemplary handheld device incorporating the hybrid heat spreader and temperature sensor described herein, according to various aspects.

According to various aspects, referring now to FIG. 5, an exemplary handheld device incorporating the hybrid heat spreader and temperature sensor described herein is illustrated therein. In various embodiments, the handheld device shown in FIG. 5 may include a display 520 located at a front surface, a back cover 530 thermally coupled to the hybrid heat spreader and temperature sensor 500 to spread heat over a system-on-chip (SoC) 516 provided in an integrated circuit package 518, and a printed circuit board 510 with a connection 502 to the hybrid heat spreader and temperature sensor 500 thermally coupled to the back cover 530. Furthermore, in various embodiments, those skilled in the art will appreciate that the connection 502 to the hybrid heat spreader and temperature sensor 500 may be a two-wire connection as shown in FIG. 4A or a four-wire connection as shown in FIG. 4B. In either case, to measure the external skin temperature at the back cover 530, the connection 502 may be used to apply a current to the hybrid heat spreader and temperature sensor 500 such that a resistance in the hybrid heat spreader and temperature sensor 500 can be measured and correlated to the external skin temperature at the back cover 530.

Figure 6A:
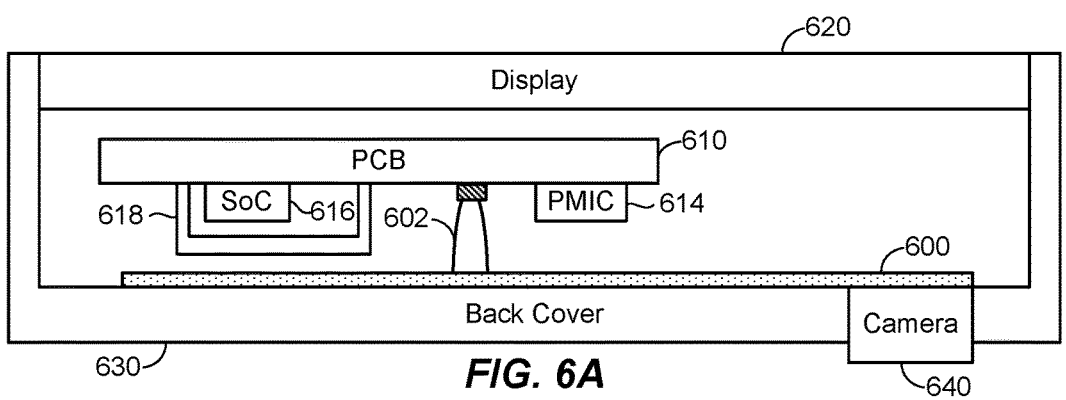
FIG. 6A-6B illustrate an exemplary design extending the hybrid heat spreader and temperature sensor to multiple potential hotspots to thereby increase skin temperature resolution and mitigation accuracy, according to various aspects.
Figure 6B:
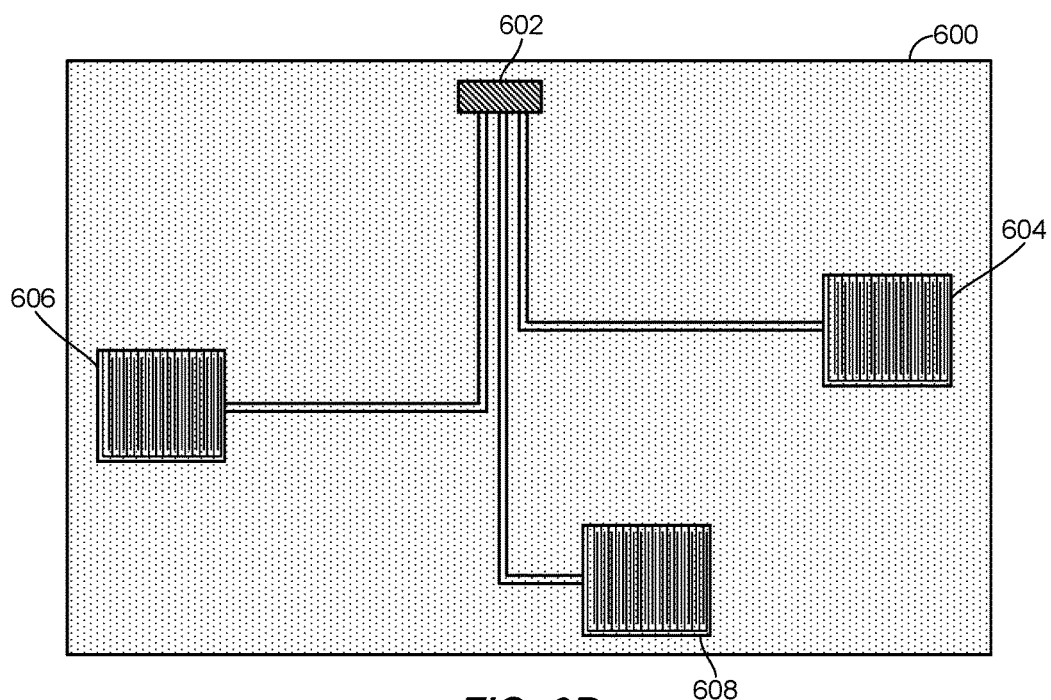

According to various aspects, referring now to FIGS. 6A and 6B, an exemplary design extending the hybrid heat spreader and temperature sensor to multiple potential hotspots to thereby increase skin temperature resolution and mitigation accuracy is illustrated therein. In various embodiments, the handheld device shown in FIG. 6A may be similar to the handheld device shown in FIG. 5, in that the handheld device includes a display 620 located at a front surface, a back cover 630 thermally coupled to the hybrid heat spreader and temperature sensor 600 and a printed circuit board 610 with a connection 602 to the hybrid heat spreader and temperature sensor 600. However, the particular design shown in FIG. 6A differs from FIG. 5B in that the handheld device includes a power management integrated circuit (PMIC) 614 coupled to the printed circuit board 610 and a camera 640 arranged at or near the back cover 630 in addition to a system-on-chip (SoC) 616 provided in an integrated circuit package 618. As such, according to various embodiments, the hybrid heat spreader and temperature sensor 600 as shown in FIG. 6A-6B may be designed to spread heat over the SoC 616, the PMIC 614, and the camera 640. Accordingly, as shown in FIG. 6B, the hybrid heat spreader and temperature sensor 600 may be designed with resistance temperature detectors 604, 606, 608 that each have the design shown in FIG. 3B in order to measure resistance (and therefore skin temperature) over different potential hotspots that the SoC 616, the PMIC 614, and the camera 640 may create on the back cover 630. As such, the connection 602 between the printed circuit board 610 and the hybrid heat spreader and temperature sensor 600 may include a two-wire and/or four-wire connection to each resistance temperature detectors 604, 606, 608 such that resistance at each potential hotspot on the back cover 630 can be separately measured, thereby increasing skin temperature resolution and mitigation accuracy over the various potential hotspots.

According to various aspects, FIG. 7A-7F illustrate an exemplary process flow that can be used to form the hybrid heat spreader and temperature sensor described herein. More particularly, as shown in FIG. 7A, a metal sheet 710 may be placed over a dielectric material 700 as a holder, wherein the metal sheet 710 may be formed from copper, graphite, or another suitable heat spreading material. As shown in FIG. 7B, a mask 715 may then be placed over the metal sheet 710, wherein the mask 715 may comprise an inverse pattern corresponding to a pattern in which various recesses are to be formed in the metal sheet 710. As shown in FIG. 7C, a chemical or plasma etching process 720 may then be applied, which may result in the structure shown in FIG. 7D where areas in the metal sheet 710 that the mask 715 left exposed have been etched away and the metal sheet 710 has been reduced to those areas 712 that the mask 715 was covering. The mask 715 may then be removed, resulting in the structure shown in FIG. 7E where various recesses 714 are formed between the remaining areas 712 in the metal sheet 710. In various embodiments, as shown in FIG. 7F, the various recesses 714 may then be filled with a dielectric material 716 to form the final the hybrid heat spreader and temperature sensor structure.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the various aspects and embodiments described herein.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The methods, sequences, and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of non-transitory computer-readable medium known in the art. An exemplary non-transitory computer-readable medium may be coupled to the processor such that the processor can read information from, and write information to, the non-transitory computer-readable medium. In the alternative, the non-transitory computer-readable medium may be integral to the processor. The processor and the non-transitory computer-readable medium may reside in an ASIC. The ASIC may reside in an IoT device. In the alternative, the processor and the non-transitory computer-readable medium may be discrete components in a user terminal.

In one or more exemplary aspects, the functions described may be implemented in hardware, software, firmware, or any combination thereof. If implemented in software, the functions may be stored on or transmitted over as one or more instructions or code on a non-transitory computer-readable medium. Computer-readable media may include storage media and/or communication media including any non-transitory medium that may facilitate transferring a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of a medium. The term disk and disc, which may be used interchangeably herein, includes CD, laser disc, optical disc, DVD, floppy disk, and Blu-ray discs, which usually reproduce data magnetically and/or optically with lasers. Combinations of the above should also be included within the scope of computer-readable media.

While the foregoing disclosure shows illustrative aspects and embodiments, those skilled in the art will appreciate that various changes and modifications could be made herein without departing from the scope of the disclosure as defined by the appended claims. Furthermore, in accordance with the various illustrative aspects and embodiments described herein, those skilled in the art will appreciate that the functions, steps, and/or actions in any methods described above and/or recited in any method claims appended hereto need not be performed in any particular order. Further still, to the extent that any elements are described above or recited in the appended claims in a singular form, those skilled in the art will appreciate that singular form(s) contemplate the plural as well unless limitation to the singular form(s) is explicitly stated.

What is claimed is:

1. A handheld electronic device, comprising:
   at least one external surface;
   a heat spreader thermally coupled to the at least one external surface, wherein the heat spreader comprises at least one region having a plurality of recesses arranged to produce an electrical resistance in the at least one region; and
   a circuit electrically connected to the heat spreader, the circuit configured to measure the electrical resistance in the at least one region and to correlate the measured electrical resistance to a skin temperature on the at least one external surface.

2. The handheld electronic device recited in claim 1, wherein the heat spreader is formed from a thermally and electrically conductive material.

3. The handheld electronic device recited in claim 2, the thermally and electrically conductive material having a substantially linear resistance-to-temperature correlation.

4. The handheld electronic device recited in claim 3, wherein the circuit is further configured to determine a maximum allowable electrical resistance in the at least one region based on a maximum allowable skin temperature on the at least one external surface and the substantially linear resistance-to-temperature correlation associated with the thermally and electrically conductive material used to form the heat spreader.

5. The handheld electronic device recited in claim 4, wherein the circuit is further configured to initiate one or more mitigation techniques to reduce the skin temperature on the at least one external surface based on the measured electrical resistance in the at least one region exceeding the maximum allowable electrical resistance.

6. The handheld electronic device recited in claim 2, wherein the thermally and electrically conductive material comprises copper.

7. The handheld electronic device recited in claim 1, wherein the circuit is further configured to flow a current through the at least one region in the heat spreader and to measure the electrical resistance in the at least one region based on a voltage drop across at least one of the plurality of recesses formed in the at least one region.

8. The handheld electronic device recited in claim 7, wherein the circuit is further configured to measure the voltage drop across the at least one recess according to a two-wire Kelvin method.

9. The handheld electronic device recited in claim 7, wherein the circuit is further configured to measure the voltage drop across the at least one recess according to a four-wire Kelvin method.

10. The handheld electronic device recited in claim 1, wherein the at least one region in which the plurality of recesses are formed is located over a potential hotspot on the at least one external surface.

11. The handheld electronic device recited in claim 10, wherein the potential hotspot is located substantially near one or more heat-generating electronic components.

12. A method for directly measuring skin temperature in a handheld electronic device, comprising:
    causing a current to flow through at least one region in a heat spreader thermally coupled to at least one external surface of the handheld electronic device, wherein a plurality of recesses are formed in the at least one region of the heat spreader to produce an electrical resistance in the at least one region;
    measuring the electrical resistance produced in the at least one region; and
    correlating the measured electrical resistance to a skin temperature on the at least one external surface.

13. The method recited in claim 12, wherein the heat spreader is formed from a thermally and electrically conductive material having a substantially linear resistance-to-temperature correlation.

14. The method recited in claim 13, further comprising:
    determining a maximum allowable electrical resistance in the at least one region based on a maximum allowable skin temperature on the at least one external surface and the substantially linear resistance-to-temperature correlation associated with the thermally and electrically conductive material used to form the heat spreader; and
    initiating one or more mitigation techniques to reduce the skin temperature on the at least one external surface in response to the measured electrical resistance in the at least one region exceeding the maximum allowable electrical resistance.

15. The method recited in claim 12, further comprising:
    measuring a voltage drop across at least one of the plurality of recesses formed in the at least one region, wherein the measured electrical resistance produced in the at least one region is determined based on the voltage drop across the at least one recess.

16. The method recited in claim 15, wherein the voltage drop across the at least one recess is measured according to a two-wire Kelvin method.

17. The method recited in claim 15, wherein the voltage drop across the at least one recess is measured according to a four-wire Kelvin method.

18. The method recited in claim 12, wherein the at least one region in which the plurality of recesses are formed is located over a potential hotspot on the at least one external surface.

19. An apparatus, comprising:
    means for generating heat in a handheld electronic device;
    means for spreading the heat to reduce a skin temperature on at least one external surface of the handheld electronic device;
    means for producing an electrical resistance in the means for spreading the heat;
    means for measuring the electrical resistance; and
    means for determining the skin temperature on the at least one external surface based at least in part on the measured electrical resistance.

20. The apparatus recited in claim 19, wherein the means for spreading the heat comprises a thermally and electrically conductive material having a substantially linear resistance-to-temperature correlation.

21. The apparatus recited in claim 19, further comprising:
    means for determining a maximum allowable electrical resistance in the means for spreading the heat based on a maximum allowable skin temperature on the at least one external surface and the substantially linear resistance-to-temperature correlation associated with the thermally and electrically conductive material; and means for initiating one or more mitigation techniques to reduce the skin temperature on the at least one external surface based on the measured electrical resistance exceeding the maximum allowable electrical resistance.

22. The apparatus recited in claim 19, further comprising:
means for flowing a current through the means for spreading the heat; and
means for measuring a voltage drop across the means for producing the electrical resistance, wherein the measured electrical resistance is determined based on the measured voltage drop across the means for producing the electrical resistance when the current is flowed through the means for spreading the heat.

23. The apparatus recited in claim 22, wherein the voltage drop across the means for producing the electrical resistance is measured according to a two-wire Kelvin method.

24. The apparatus recited in claim 22, wherein the voltage drop across the means for producing the electrical resistance is measured according to a four-wire Kelvin method.

25. A hybrid heat spreader and skin temperature sensor, comprising:
a metal sheet formed from a thermally and electrically conductive material having a substantially linear resistance-to-temperature correlation; and
at least one resistance temperature detector formed in at least one region of the metal sheet, wherein the at least one resistance temperature detector comprises:
a plurality of recesses formed in the metal sheet; and
a first lead and a second lead formed on opposite sides of one of the plurality of recesses, wherein the plurality of recesses are formed in the metal sheet according to a pattern arranged to flow an input current applied to the first lead through the at least one region of the metal sheet along a path from the first lead to the second lead such that an electrical resistance is produced between the first lead and the second lead.

* * * * *